US010523160B2

(12) United States Patent
Ashworth

(10) Patent No.: US 10,523,160 B2
(45) Date of Patent: Dec. 31, 2019

(54) PROTECTION OF POWER AMPLIFIERS IN A SIGNAL BOOSTER

(71) Applicant: WILSON ELECTRONICS, LLC, St. George, UT (US)

(72) Inventor: Christopher Ken Ashworth, St. George, UT (US)

(73) Assignee: WILSON ELECTRONICS, LLC, St. George, UT (US)

(*) Notice: Subject to any disclaimer, the term of this patent is extended or adjusted under 35 U.S.C. 154(b) by 0 days.

(21) Appl. No.: 16/111,076

(22) Filed: Aug. 23, 2018

(65) Prior Publication Data

US 2019/0068136 A1   Feb. 28, 2019

Related U.S. Application Data

(60) Provisional application No. 62/552,887, filed on Aug. 31, 2017.

(51) Int. Cl.
 *H03F 1/52* (2006.01)
 *H03F 3/24* (2006.01)
 *H04B 7/15* (2006.01)
 *H03F 3/19* (2006.01)

(52) U.S. Cl.
 CPC ............ *H03F 1/52* (2013.01); *H03F 3/19* (2013.01); *H03F 3/245* (2013.01); *H04B 7/15* (2013.01); *H03F 2200/426* (2013.01); *H03F 2200/451* (2013.01)

(58) Field of Classification Search
 CPC ........................... H03F 1/52; H03F 3/245
 See application file for complete search history.

(56) References Cited

U.S. PATENT DOCUMENTS

| 4,645,956 A | 2/1987 | Shuey |
| 4,776,032 A | 10/1988 | Odate et al. |
| 5,095,528 A | 3/1992 | Leslie et al. |
| 5,200,955 A | 4/1993 | McFarlane et al. |
| 5,303,395 A | 4/1994 | Dayani |
| 5,426,395 A | 6/1995 | Cygan |
| 5,737,687 A | 4/1998 | Martin et al. |
| 5,777,530 A | 7/1998 | Nakatuka |

(Continued)

FOREIGN PATENT DOCUMENTS

| CN | 101741463 A | 6/2010 |
| CN | 204302741 U | 4/2015 |

(Continued)

OTHER PUBLICATIONS

3GPP2 C.S0011-B; "Recommended Minimum Performance Standards for cdma2000® Spread Spectrum Mobile Stations;" TIA-98-E; (Dec. 13, 2002); 448 pages; Release B, Version 1, Revision E.

(Continued)

*Primary Examiner* — Tuan H Nguyen
(74) *Attorney, Agent, or Firm* — Thorpe North & Western

(57) ABSTRACT

Technology for a repeater is disclosed. The repeater can include a power amplifier and a controller. The controller can determine whether a load is connected to the repeater. The controller can protect the power amplifier when the load is not connected to the repeater by disabling the power amplifier. The controller can unprotect the power amplifier when the load is connected to the repeater by enabling the power amplifier.

29 Claims, 7 Drawing Sheets

(56) References Cited

U.S. PATENT DOCUMENTS

| | | | |
|---|---|---|---|
| 5,835,848 A | 11/1998 | Bi et al. | |
| 5,912,641 A | 6/1999 | Dietrich | |
| 5,937,332 A | 8/1999 | Karabinis | |
| 6,005,224 A | 12/1999 | Cook et al. | |
| 6,711,388 B1 | 3/2004 | Neitiniemi | |
| 6,889,033 B2 | 5/2005 | Bongfeldt | |
| 6,990,313 B1 | 1/2006 | Yarkosky | |
| 7,035,587 B1 | 4/2006 | Yarkosky | |
| 7,221,967 B2 | 5/2007 | Van Buren et al. | |
| 7,233,771 B2 | 6/2007 | Proctor, Jr. et al. | |
| 7,454,167 B2 | 11/2008 | Cleveland | |
| 7,519,323 B2 | 4/2009 | Mohebbi | |
| 7,577,398 B2 | 8/2009 | Judd et al. | |
| 7,881,659 B2 | 2/2011 | Utakouji et al. | |
| 7,917,084 B2 | 3/2011 | MacConnell | |
| 7,974,573 B2 | 7/2011 | Dean | |
| 8,005,513 B2 | 8/2011 | Risheq et al. | |
| 8,019,278 B2 | 9/2011 | Baraz et al. | |
| 8,049,664 B2 | 11/2011 | Millard et al. | |
| 8,060,009 B2 | 11/2011 | Gainey et al. | |
| 8,452,232 B2 | 5/2013 | Cho | |
| 8,768,365 B2 | 7/2014 | Hoymann et al. | |
| 8,818,292 B1 | 8/2014 | Ashworth et al. | |
| 9,037,190 B2 | 5/2015 | Desclos et al. | |
| 9,094,083 B2 | 7/2015 | Hunzinger | |
| 9,301,152 B2 | 3/2016 | Medbo et al. | |
| 9,313,733 B2 | 4/2016 | Moshfeghi et al. | |
| 9,496,945 B2 | 11/2016 | Almgren et al. | |
| 9,660,720 B2 | 5/2017 | Hoymann et al. | |
| 2002/0044594 A1 | 4/2002 | Bongfeldt | |
| 2003/0123401 A1* | 7/2003 | Dean | H04B 7/15535 |
| | | | 370/318 |
| 2004/0137854 A1 | 7/2004 | Ge | |
| 2004/0146013 A1 | 7/2004 | Song et al. | |
| 2004/0166802 A1 | 8/2004 | McKay, Sr. et al. | |
| 2004/0219876 A1 | 11/2004 | Baker et al. | |
| 2004/0235417 A1 | 11/2004 | Dean | |
| 2005/0118949 A1 | 6/2005 | Allen et al. | |
| 2005/0206530 A1* | 9/2005 | Cumming | G01D 4/006 |
| | | | 340/870.02 |
| 2006/0084379 A1 | 4/2006 | O'Neill | |
| 2007/0071128 A1* | 3/2007 | Meir | H03G 3/3042 |
| | | | 375/297 |
| 2007/0188235 A1 | 8/2007 | Dean | |
| 2008/0081555 A1 | 4/2008 | Kong et al. | |
| 2008/0096483 A1 | 4/2008 | Van Buren et al. | |
| 2008/0278237 A1 | 11/2008 | Blin | |
| 2011/0151775 A1 | 6/2011 | Kang et al. | |
| 2013/0049735 A1* | 2/2013 | Shafer | H03F 1/523 |
| | | | 324/76.11 |
| 2016/0255599 A1 | 9/2016 | Shi et al. | |
| 2017/0141837 A1 | 5/2017 | Cook et al. | |
| 2018/0139626 A1 | 5/2018 | Ashworth et al. | |

FOREIGN PATENT DOCUMENTS

| | | |
|---|---|---|
| EP | 1525678 B1 | 7/2008 |
| GB | 2502143 A | 11/2013 |
| JP | 2001007749 A | 1/2001 |

OTHER PUBLICATIONS

ADL5513; "1 MHz to 4 GHz, 80 dB Logarithmic Detector / Controller;" Data sheet; (2008); 25 pages.

Dekolink Wireless Ltd.; "Digital Repeater;" Product Manual; (2004); pp. 4-9; DBDAPS950W90 Bi-Directional Booster; 302-2004 Rev. 2.0.

Futurecom Systems Group, ULC; "PDR8000 Portable Digital Repeater Product Planner;" Preliminary Version for Release 3; Motorola Solutions, Inc.; (Mar. 2, 2018); p. 9; Document 8K088X02-R3.0 Rev. 3.0.

HMC713LP3E; "54 dB, Logarithmic Detector / Controller, 50—8000 MHz;" Data Sheet (2010); 12 pages.

HMC909LP4E; "RMS Power Detector Single-Ended, DC—5.8 GHz;" Data Sheet; (2010); 21 pages.

PIC16F873; "28/40-Pin 8-Bit CMOS FLASH Microcontrollers;" Data Sheet; (2001); 218 pages.

Sherry (NM6DX); "Final Failures in Yaesu and Icom HF;" eHam. net—Ham Radio on the Net; [Forum]; (Feb. 24, 2012); [retrieved on Nov. 21, 2018]; 13 pages; Retrieved from <URL: https://www.eham.net/articles/27672 >.

Zhang et al.; "Low Cost Solution to Enhance Performance of CDMA Repeater Amplifier;" Asia-Pacific Microwave Conference (APMC) 2005 Proceedings; (2005); 3 pages; IEEE.

* cited by examiner

PROTECTION OF POWER AMPLIFIERS IN A SIGNAL BOOSTER

RELATED APPLICATIONS

The present application claims the benefit of U.S. Provisional Patent Application No. 62/552,887, filed Aug. 31, 2017, the entire specification of which is hereby incorporated by reference in its entirety for all purposes.

BACKGROUND

Signal boosters and repeaters can be used to increase the quality of wireless communication between a wireless device and a wireless communication access point, such as a cell tower. Signal boosters can improve the quality of the wireless communication by amplifying, filtering, and/or applying other processing techniques to uplink and downlink signals communicated between the wireless device and the wireless communication access point.

As an example, the signal booster can receive, via an antenna, downlink signals from the wireless communication access point. The signal booster can amplify the downlink signal and then provide an amplified downlink signal to the wireless device. In other words, the signal booster can act as a relay between the wireless device and the wireless communication access point. As a result, the wireless device can receive a stronger signal from the wireless communication access point. Similarly, uplink signals from the wireless device (e.g., telephone calls and other data) can be directed to the signal booster. The signal booster can amplify the uplink signals before communicating, via an antenna, the uplink signals to the wireless communication access point.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
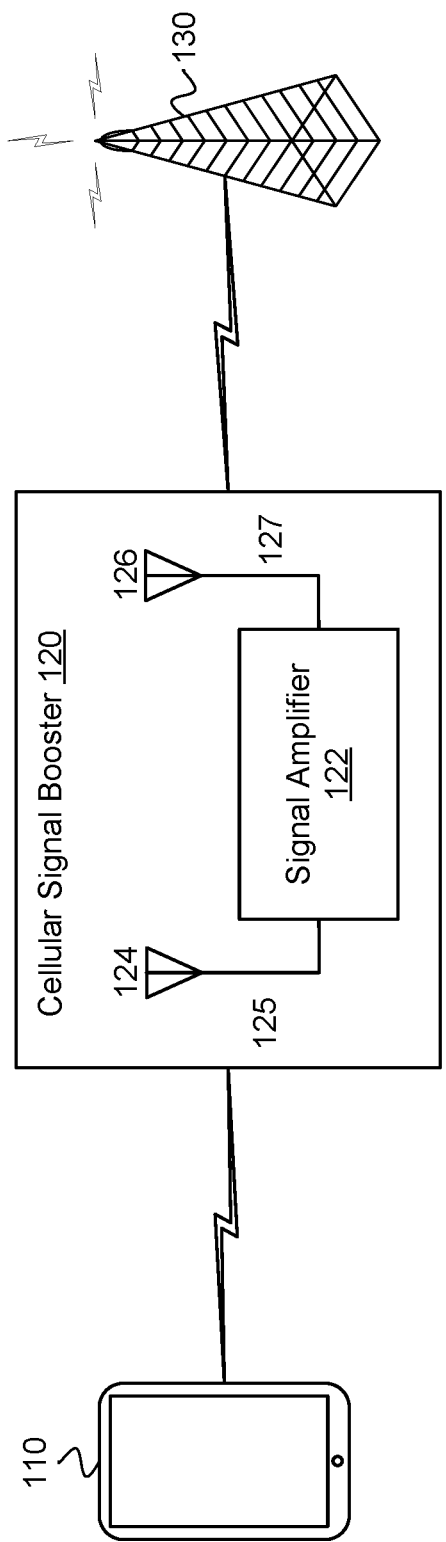
FIG. 1 illustrates a signal booster in communication with a wireless device and a base station in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

EXAMPLE EMBODIMENTS

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

FIG. 1 illustrates an exemplary signal booster 120 in communication with a wireless device 110 and a base station 130. The signal booster 120 can be referred to as a repeater. A repeater can be an electronic device used to amplify (or boost) signals. The signal booster 120 (also referred to as a cellular signal amplifier) can improve the quality of wireless communication by amplifying, filtering, and/or applying other processing techniques via a signal amplifier 122 to uplink signals communicated from the wireless device 110 to the base station 130 and/or downlink signals communicated from the base station 130 to the wireless device 110. In other words, the signal booster 120 can amplify or boost uplink signals and/or downlink signals bi-directionally. In one example, the signal booster 120 can be at a fixed location, such as in a home or office. Alternatively, the signal booster 120 can be attached to a mobile object, such as a vehicle or a wireless device 110.

In one configuration, the signal booster 120 can include an integrated device antenna 124 (e.g., an inside antenna or a coupling antenna) and an integrated node antenna 126 (e.g., an outside antenna). The integrated node antenna 126 can receive the downlink signal from the base station 130. The downlink signal can be provided to the signal amplifier 122 via a second coaxial cable 127 or other type of radio frequency connection operable to communicate radio frequency signals. The signal amplifier 122 can include one or more cellular signal amplifiers for amplification and filtering. The downlink signal that has been amplified and filtered can be provided to the integrated device antenna 124 via a first coaxial cable 125 or other type of radio frequency connection operable to communicate radio frequency signals. The integrated device antenna 124 can wirelessly communicate the downlink signal that has been amplified and filtered to the wireless device 110.

Similarly, the integrated device antenna 124 can receive an uplink signal from the wireless device 110. The uplink signal can be provided to the signal amplifier 122 via the first coaxial cable 125 or other type of radio frequency connection operable to communicate radio frequency signals. The signal amplifier 122 can include one or more cellular signal amplifiers for amplification and filtering. The uplink signal that has been amplified and filtered can be provided to the integrated node antenna 126 via the second coaxial cable 127 or other type of radio frequency connection operable to communicate radio frequency signals. The integrated device antenna 126 can communicate the uplink signal that has been amplified and filtered to the base station 130.

In one example, the signal booster 120 can filter the uplink and downlink signals using any suitable analog or digital filtering technology including, but not limited to, surface acoustic wave (SAW) filters, bulk acoustic wave (BAW) filters, film bulk acoustic resonator (FBAR) filters, ceramic filters, waveguide filters or low-temperature co-fired ceramic (LTCC) filters.

In one example, the signal booster 120 can send uplink signals to a node and/or receive downlink signals from the node. The node can comprise a wireless wide area network (WWAN) access point (AP), a base station (BS), an evolved Node B (eNB), a baseband unit (BBU), a remote radio head (RRH), a remote radio equipment (RRE), a relay station (RS), a radio equipment (RE), a remote radio unit (RRU), a central processing module (CPM), or another type of WWAN access point.

In one configuration, the signal booster 120 used to amplify the uplink and/or a downlink signal is a handheld booster. The handheld booster can be implemented in a sleeve of the wireless device 110. The wireless device sleeve can be attached to the wireless device 110, but can be removed as needed. In this configuration, the signal booster 120 can automatically power down or cease amplification when the wireless device 110 approaches a particular base station. In other words, the signal booster 120 can determine to stop performing signal amplification when the quality of uplink and/or downlink signals is above a defined threshold based on a location of the wireless device 110 in relation to the base station 130.

In one example, the signal booster 120 can include a battery to provide power to various components, such as the signal amplifier 122, the integrated device antenna 124 and the integrated node antenna 126. The battery can also power the wireless device 110 (e.g., phone or tablet). Alternatively, the signal booster 120 can receive power from the wireless device 110.

In one configuration, the signal booster 120 can be a Federal Communications Commission (FCC)-compatible consumer signal booster. As a non-limiting example, the signal booster 120 can be compatible with FCC Part 20 or 47 Code of Federal Regulations (C.F.R.) Part 20.21 (Mar. 21, 2013). In addition, the signal booster 120 can operate on the frequencies used for the provision of subscriber-based services under parts 22 (Cellular), 24 (Broadband PCS), 27 (AWS-1, 700 MHz Lower A-E Blocks, and 700 MHz Upper C Block), and 90 (Specialized Mobile Radio) of 47 C.F.R. The signal booster 120 can be configured to automatically self-monitor its operation to ensure compliance with applicable noise and gain limits. The signal booster 120 can either self-correct or shut down automatically if the signal booster's operations violate the regulations defined in FCC Part 20.21.

In one configuration, the signal booster 120 can improve the wireless connection between the wireless device 110 and the base station 130 (e.g., cell tower) or another type of wireless wide area network (WWAN) access point (AP). The signal booster 120 can boost signals for cellular standards, such as the Third Generation Partnership Project (3GPP) Long Term Evolution (LTE) Release 8, 9, 10, 11, 12, or 13 standards or Institute of Electronics and Electrical Engineers (IEEE) 802.16. In one configuration, the signal booster 120 can boost signals for 3GPP LTE Release 13.0.0 (March 2016) or other desired releases. The signal booster 120 can boost signals from the 3GPP Technical Specification 36.101 (Release 12 Jun. 2015) bands or LTE frequency bands. For example, the signal booster 120 can boost signals from the LTE frequency bands: 2, 4, 5, 12, 13, 17, and 25. In addition, the signal booster 120 can boost selected frequency bands based on the country or region in which the signal booster is used, including any of bands 1-70 or other bands, as disclosed in ETSI TS136 104 V13.5.0 (2016-10).

The number of LTE frequency bands and the level of signal improvement can vary based on a particular wireless device, cellular node, or location. Additional domestic and international frequencies can also be included to offer increased functionality. Selected models of the signal booster 120 can be configured to operate with selected frequency bands based on the location of use. In another example, the signal booster 120 can automatically sense from the wireless device 110 or base station 130 (or GPS, etc.) which frequencies are used, which can be a benefit for international travelers.

In one example, the integrated device antenna 124 and the integrated node antenna 126 can be comprised of a single antenna, an antenna array, or have a telescoping form-factor. In another example, the integrated device antenna 124 and the integrated node antenna 126 can be a microchip antenna. An example of a microchip antenna is AMMAL001. In yet another example, the integrated device antenna 124 and the integrated node antenna 126 can be a printed circuit board (PCB) antenna. An example of a PCB antenna is TE 2118310-1.

In one example, the integrated device antenna 124 can receive uplink (UL) signals from the wireless device 100 and transmit DL signals to the wireless device 100 using a single antenna. Alternatively, the integrated device antenna 124 can receive UL signals from the wireless device 100 using a dedicated UL antenna, and the integrated device antenna 124 can transmit DL signals to the wireless device 100 using a dedicated DL antenna.

In one example, the integrated device antenna 124 can communicate with the wireless device 110 using near field communication. Alternatively, the integrated device antenna 124 can communicate with the wireless device 110 using far field communication.

In one example, the integrated node antenna 126 can receive downlink (DL) signals from the base station 130 and transmit uplink (UL) signals to the base station 130 via a single antenna. Alternatively, the integrated node antenna 126 can receive DL signals from the base station 130 using a dedicated DL antenna, and the integrated node antenna 126 can transmit UL signals to the base station 130 using a dedicated UL antenna.

In one configuration, multiple signal boosters can be used to amplify UL and DL signals. For example, a first signal booster can be used to amplify UL signals and a second signal booster can be used to amplify DL signals. In addition, different signal boosters can be used to amplify different frequency ranges.

In one configuration, the signal booster 120 can be configured to identify when the wireless device 110 receives a relatively strong downlink signal. An example of a strong downlink signal can be a downlink signal with a signal strength greater than approximately −80 dBm. The signal booster 120 can be configured to automatically turn off selected features, such as amplification, to conserve battery life. When the signal booster 120 senses that the wireless device 110 is receiving a relatively weak downlink signal, the integrated booster can be configured to provide amplification of the downlink signal. An example of a weak downlink signal can be a downlink signal with a signal strength less than −80 dBm.

In one example, the signal booster 120 can also include one or more of: a waterproof casing, a shock absorbent casing, a flip-cover, a wallet, or extra memory storage for the wireless device. In one example, extra memory storage can be achieved with a direct connection between the signal booster 120 and the wireless device 110. In another example, Near-Field Communications (NFC), Bluetooth v4.0, Bluetooth Low Energy, Bluetooth v4.1, Bluetooth v4.2, Bluetooth 5, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, or IEEE 802.11ad can be used to couple the signal booster 120 with the wireless device 110 to enable data from the wireless device 110 to be communicated to and stored in the extra memory storage that is integrated in the signal booster 120. Alternatively, a connector can be used to connect the wireless device 110 to the extra memory storage.

In one example, the signal booster 120 can include photovoltaic cells or solar panels as a technique of charging the integrated battery and/or a battery of the wireless device 110. In another example, the signal booster 120 can be configured to communicate directly with other wireless devices with signal boosters. In one example, the integrated node antenna 126 can communicate over Very High Frequency (VHF) communications directly with integrated node antennas of other signal boosters. The signal booster 120 can be configured to communicate with the wireless device 110 through a direct connection, Near-Field Communications (NFC), Bluetooth v4.0, Bluetooth Low Energy, Bluetooth v4.1, Bluetooth v4.2, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, IEEE 802.11ad, a TV White Space Band (TVWS), or any other industrial, scientific and medical (ISM) radio band. Examples of such ISM bands include 2.4 GHz, 3.6 GHz, 4.9 GHz, 5 GHz, or 5.9 GHz. This configuration can allow data to pass at high rates between multiple wireless devices with signal boosters. This configuration can also allow users to send text messages, initiate phone calls, and engage in video communications between wireless devices with signal boosters. In one example, the integrated node antenna 126 can be configured to couple to the wireless device 110. In other words, communications between the integrated node antenna 126 and the wireless device 110 can bypass the integrated booster.

In another example, a separate VHF node antenna can be configured to communicate over VHF communications directly with separate VHF node antennas of other signal boosters. This configuration can allow the integrated node antenna 126 to be used for simultaneous cellular communications. The separate VHF node antenna can be configured to communicate with the wireless device 110 through a direct connection, Near-Field Communications (NFC), Bluetooth v4.0, Bluetooth Low Energy, Bluetooth v4.1, Bluetooth v4.2, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, IEEE 802.11ad, a TV White Space Band (TVWS), or any other industrial, scientific and medical (ISM) radio band.

In one configuration, the signal booster 120 can be configured for satellite communication. In one example, the integrated node antenna 126 can be configured to act as a satellite communication antenna. In another example, a separate node antenna can be used for satellite communications. The signal booster 120 can extend the range of coverage of the wireless device 110 configured for satellite communication. The integrated node antenna 126 can receive downlink signals from satellite communications for the wireless device 110. The signal booster 120 can filter and amplify the downlink signals from the satellite communication. In another example, during satellite communications, the wireless device 110 can be configured to couple to the signal booster 120 via a direct connection or an ISM radio band. Examples of such ISM bands include 2.4 GHz, 3.6 GHz, 4.9 GHz, 5 GHz, or 5.9 GHz.

Figure 2:
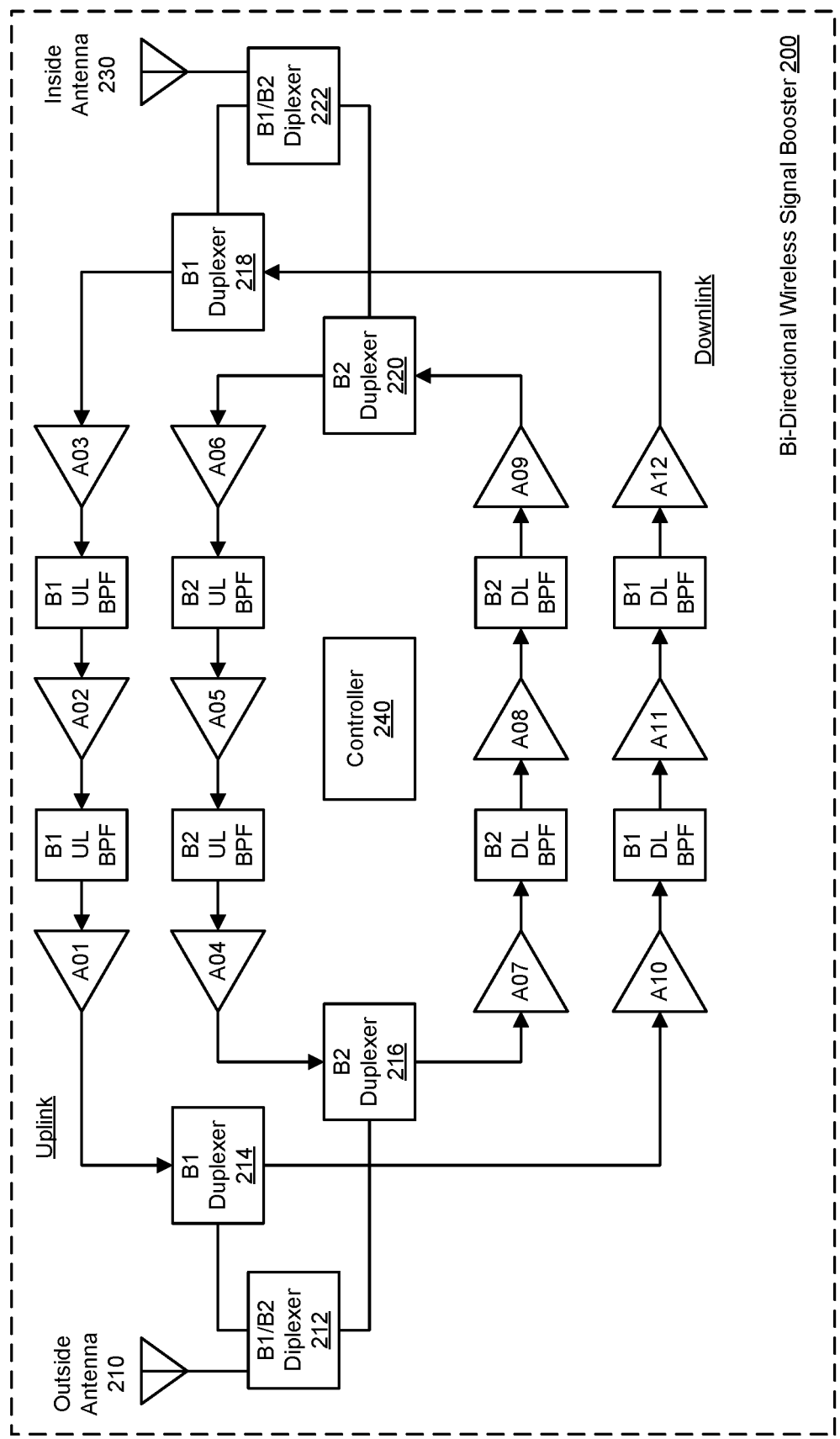
FIG. 2 illustrates a cellular signal booster configured to amplify uplink (UL) and downlink (DL) signals using one or more downlink signal paths and one or more uplink signal paths in accordance with an example.

FIG. 2 illustrates an exemplary bi-directional wireless signal booster 200 configured to amplify uplink (UL) and downlink (DL) signals using a separate signal path for each UL frequency band and DL frequency band and a controller 240. An outside antenna 210, or an integrated node antenna, can receive a downlink signal. For example, the downlink signal can be received from a base station (not shown). The downlink signal can be provided to a first B1/B2 diplexer 212, wherein B1 represents a first frequency band and B2 represents a second frequency band. The first B1/B2 diplexer 212 can create a B1 downlink signal path and a B2 downlink signal path. Therefore, a downlink signal that is associated with B1 can travel along the B1 downlink signal path to a first B1 duplexer 214, or a downlink signal that is associated with B2 can travel along the B2 downlink signal path to a first B2 duplexer 216. After passing the first B1 duplexer 214, the downlink signal can travel through a series of amplifiers (e.g., A10, A11 and A12) and downlink band pass filters (BPF) to a second B1 duplexer 218. Alternatively, after passing the first B2 duplexer 216, the downlink can travel through a series of amplifiers (e.g., A07, A08 and A09) and downlink band pass filters (BFF) to a second B2 duplexer 220. At this point, the downlink signal (B1 or B2) has been amplified and filtered in accordance with the type of amplifiers and BPFs included in the bi-directional wireless signal booster 200. The downlink signals from the second B1 duplexer 218 or the second B2 duplexer 220, respectively, can be provided to a second B1/B2 diplexer 222. The second B1/B2 diplexer 222 can provide an amplified downlink signal to an inside antenna 230, or an integrated device antenna. The inside antenna 230 can communicate the amplified downlink signal to a wireless device (not shown), such as a mobile phone.

In one example, the inside antenna 230 can receive an uplink (UL) signal from the wireless device. The uplink signal can be provided to the second B1/B2 diplexer 222. The second B1/B2 diplexer 222 can create a B1 uplink signal path and a B2 uplink signal path. Therefore, an uplink signal that is associated with B1 can travel along the B1 uplink signal path to the second B1 duplexer 218, or an uplink signal that is associated with B2 can travel along the B2 uplink signal path to the second B2 duplexer 222. After passing the second B1 duplexer 218, the uplink signal can travel through a series of amplifiers (e.g., A01, A02 and A03) and uplink band pass filters (BPF) to the first B1 duplexer 214. Alternatively, after passing the second B2 duplexer 220, the uplink signal can travel through a series of amplifiers (e.g., A04, A05 and A06) and uplink band pass filters (BPF) to the first B2 duplexer 216. At this point, the uplink signal (B1 or B2) has been amplified and filtered in accordance with the type of amplifiers and BFFs included in the bi-directional wireless signal booster 200. The uplink signals from the first B1 duplexer 214 or the first B2 duplexer 216, respectively, can be provided to the first B1/B2 diplexer 212. The first B1/B2 diplexer 212 can provide an amplified uplink signal to the outside antenna 210. The outside antenna can communicate the amplified uplink signal to the base station.

In one example, the bi-directional wireless signal booster 200 can be a 6-band booster. In other words, the bi-directional wireless signal booster 200 can perform amplification and filtering for downlink and uplink signals having a frequency in bands B1, B2, B3 B4, B5 and/or B6.

In one example, the bi-directional wireless signal booster 200 can use the duplexers to separate the uplink and downlink frequency bands, which are then amplified and filtered separately. A multiple-band cellular signal booster can typically have dedicated radio frequency (RF) amplifiers (gain blocks), RF detectors, variable RF attenuators and RF filters for each uplink and downlink band.

In one configuration, a signal booster (or repeater) can be used to amplify wireless communication for increased coverage, improved call clarity, and better data throughput. The signal booster can utilize amplifiers to increase the signal strength between user equipment devices and base stations, cell towers, radio transmitters, access points, etc. The amplifiers can be designed for operating with a predetermined load impedance. However, during setup and operation, antennas may not be connected to the signal booster before the amplifiers are powered up, or can be disconnected while the amplifiers are powered up. As a result, the load impedance of an amplifier (e.g., a power amplifier) can be outside the predetermined operating range of the amplifiers when one or more antennas are disconnected from the signal booster. In such cases, the amplifier can be damaged when operating with a load impedance outside the predetermined operating range. In other words, the amplifier can be damaged as a result of poor return losses when there is no load coupled to an output of the amplifier (i.e., when the antennas are not connected to the signal booster before the amplifier is powered on or the antennas are disconnected while the amplifier is powered on).

In one example, a power amplifier in a signal booster can break when the power amplifier is powered on when a coaxial cable communicatively coupled to the power amplifier is unterminated. For example, when the power amplifier is powered on and the coaxial cable is unterminated, radio frequency (RF) signals can be reflected back on the coaxial cable and potentially break the power amplifier. In this case, since the coaxial cable is unterminated, the coaxial cable does not end with a device that matches a characteristic impedance of the coaxial cable. The non-termination of the coaxial cable can cause the RF signals to be reflected off an end of the coaxial cable, thereby potentially breaking the power amplifier in the signal booster. Therefore, it would be desirable to protect the power amplifier in the signal booster during a situation in which the coaxial cable communicatively coupled to the power amplifier is unterminated.

In the present technology, power amplifiers in the signal booster can be protected by detecting whether a load is connected to a booster port of the signal booster. For example, the load can be coupled to a coaxial cable that is attached to an inside antenna of the signal booster, or the load can be coupled to a coaxial cable that is attached to an outside antenna of the signal booster. Thus, the load can be coupled to an inside coaxial cable attached to an inside antenna port of the signal booster, or the load can be coupled to an outside coaxial cable attached to an outside antenna port of the signal booster. The load can be a light emitting diode (LED) or a resistor connected to ground. When a load is connected (i.e., a coaxial cable is terminated), it can be safe to turn on power amplifiers in the signal booster. In other words, when the load is connected, RF signals are unlikely to be reflected back on a coaxial cable and damage the power amplifiers. On the other hand, when a load is not connected (i.e., a coaxial cable is unterminated), it is not safe to turn on the power amplifiers in the signal booster. In other words, turning on the power amplifiers when there is no load connected would likely cause RF signals to be reflected back on the coaxial cable and damage the power amplifiers. Therefore, when there is no load connected, the power amplifiers can remain off or be turned off, thereby protecting the power amplifiers from damage. In addition, on start-up or a power on of the signal booster, the power amplifiers can be turned off by default, and depending on whether there is a load connected, the power amplifiers can be turned on or remain off.

In the present technology, power amplifiers in the signal booster can be protected by detecting whether a return loss (e.g., a coaxial cable return loss) is less than or greater than a defined threshold. The coaxial cable return loss (expressed in decibels, or dB) can indicate a loss of power in a signal returned/reflected by a discontinuity in a coaxial cable, and this discontinuity can be a mismatch with a terminating load or with a device inserted in the coaxial cable. Generally speaking, an increased return loss is desirable and can result in a lower insertion loss. In one example, when the coaxial cable return loss is less than the defined threshold, it can be determined that an additional load is not connected (i.e., a coaxial cable is unterminated). The additional load can be an LED or a resistor connected to ground. In this case, it may not be safe to turn on the power amplifiers in the signal booster, as the non-termination of the coaxial cable can cause damage when the power amplifiers are turned on. On the other hand, when the coaxial cable return loss is greater than the defined threshold, it can be determined that an additional load is connected (i.e., a coaxial cable is terminated). In this case, it may be safe to turn on the power amplifiers in the signal booster without risk of damage to the power amplifiers when turned on in the signal booster.

Figure 3:
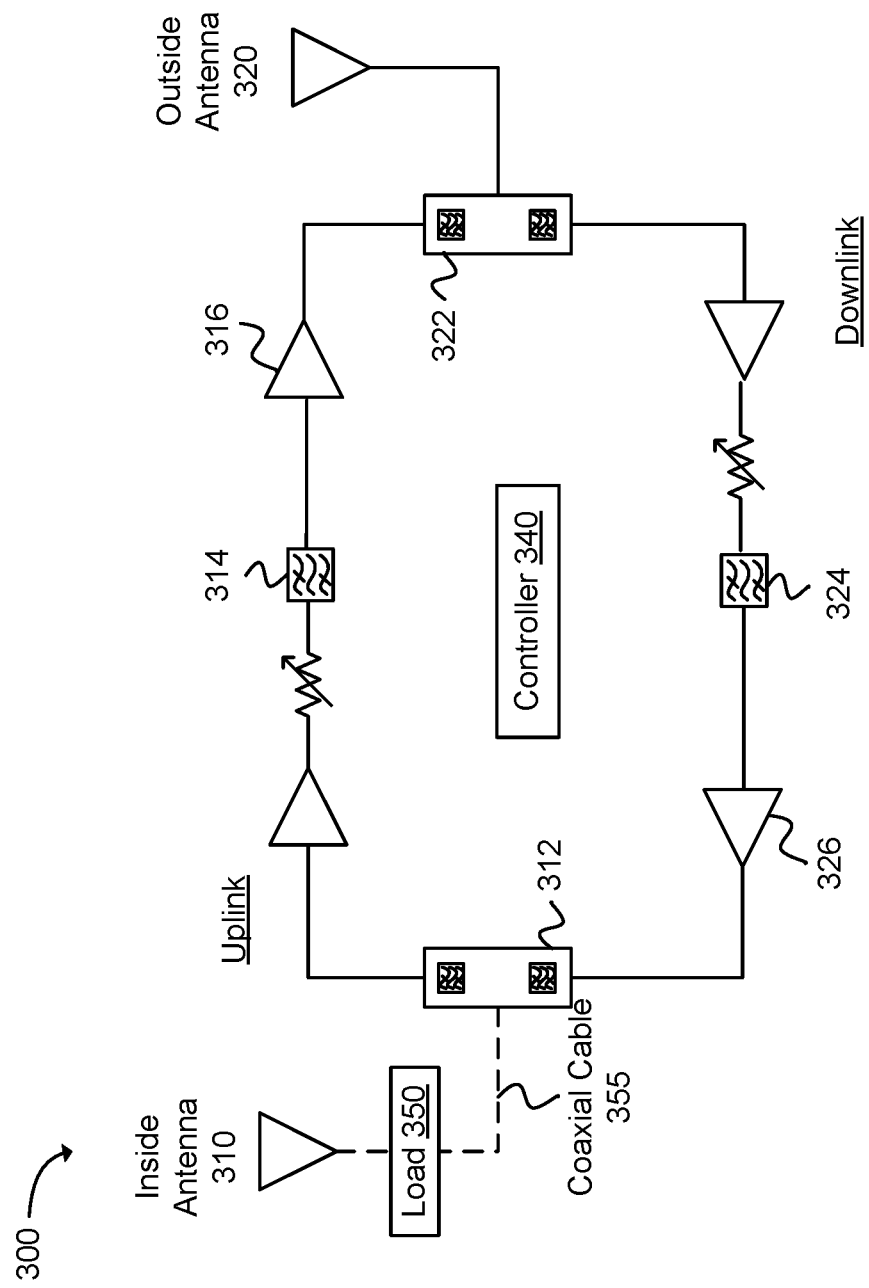
FIG. 3 illustrates a signal booster operable to protect a power amplifier in the signal booster in accordance with an example.

FIG. 3 illustrates an exemplary signal booster 300 (or repeater). The signal booster 300 can include an inside antenna 310 and a first duplexer 312 communicatively coupled to the inside antenna 310. The signal booster 300 can include an outside antenna 320 and a second duplexer 322 communicatively coupled to the outside antenna 320. The signal booster 300 can include an uplink signal path and a downlink signal path. The uplink signal path and the downlink signal path can be communicatively coupled between the first duplexer 312 and the second duplexer 322. In this example, the first duplexer 312 and the second duplexer 322 can be dual-input single-output (DISO) analog bandpass filters.

In one example, the uplink signal path and the downlink signal path can each include one or more amplifiers (e.g., low noise amplifiers (LNAs), power amplifiers (PAs)) and one or more bandpass filters. For example, the uplink signal path can include a bandpass filter 314 and a PA 316, and the downlink signal path can include a bandpass filter 324 and a PA 326. In this example, the bandpass filters can be single-input single-output (SISO) analog bandpass filters.

In one example, the uplink signal path and the downlink signal path can each include a variable attenuator. The variable attenuator can increase or decrease an amount of attenuation for a specific band in the uplink signal path or the downlink signal path, respectively. The variable attenuator can be increased in order to decrease a gain for a given band in a respective signal path, or the variable attenuator can be decreased in order to increase a gain for a given band in a respective signal path.

In one example, the outside antenna 320 in the signal booster 300 can receive a downlink signal from a base station (not shown). The downlink signal can be passed from the outside antenna 320 to the second duplexer 322. The second duplexer 322 can direct the downlink signal to the downlink signal path. The downlink signal can be amplified and filtered using one or more amplifiers and one or more filters, respectively, on the downlink signal path. The downlink signal (which has been amplified and filtered) can be directed to the first duplexer 312, and then to the inside antenna 310 in the signal booster 300. The inside antenna 310 can transmit the downlink signal to a mobile device (not shown).

In another example, the inside antenna 310 can receive an uplink signal from the mobile device. The uplink signal can be passed from the inside antenna 310 to the first duplexer 312. The first duplexer 312 can direct the uplink signal to the uplink signal path. The uplink signal can be amplified and filtered using one or more amplifiers and one or more filters, respectively, on the uplink signal path. The uplink signal (which has been amplified and filtered) can be directed to the second duplexer 322, and then to the outside antenna 320 in the signal booster 300. The outside antenna 320 can transmit the uplink signal to the base station.

In one configuration, the signal booster 300 can include a controller 340. The controller 340 can include a microcontroller or a discrete electrical circuit. The controller 340 can be configured to protect the power amplifiers 316, 326 in the signal booster 300. On start-up of the signal booster 300, the power amplifiers 316, 326 can be turned off (or disabled) by default. The controller 340 can determine that a load 350 is connected to the signal booster 300. In this example, the load 350 can be a light emitting diode (LED), but in other examples, the load 350 can be another type of device (e.g., a resistor connected to ground). The load 350 can be positioned in between the inside antenna 310 and the first duplexer 312 in the signal booster 300. The load 350 can be communicatively coupled to an inside antenna port of the inside antenna 310, and the load 350 can be communicatively coupled to the first duplexer 312 via a coaxial cable 355. The controller 340 can determine that the load 350 is connected to the signal booster 300 based on current flowing from the controller 340 to the load 350 over the coaxial cable 355. Therefore, the controller 340 can know that there is power being provided from the controller 340 to the load 350 over the coaxial cable 355, and as a result, the controller 340 can determine that the load 350 is connected to the signal booster 300. In another example, the controller 340 can perform current or voltage sensing to determine that the load 350 is connected to the signal booster 300. In yet another example, current can flow directly (or not flow) from the controller 340 to the load 350 (i.e., there is no coaxial cable 355). For example, the inside antenna 310 can be directly connected to the signal booster 300, so in this example, there is no coaxial cable 355 in the signal booster 300.

In an alternative example, the signal booster 300 can include a load that is positioned in between the outside antenna 320 and the second duplexer 322. For example, the load can be communicatively coupled to an outside antenna port of the outside antenna 320, and the load can be communicatively coupled to the second duplexer 322 via a coaxial cable connecting the second duplexer 322 and the outside antenna 320. Therefore, the signal booster 300 can include a load that is communicatively coupled to the inside antenna port of the inside antenna 310 or an outside antenna port of the outside antenna 320. In this alternative example, the controller 340 can determine whether there is a load that is connected to the signal booster 300 (e.g., connected to the outside antenna port of the signal booster 300) in a manner similar to as described above.

In one example, when the controller 340 determines that the load 350 is connected to the signal booster 300, the controller 340 can turn on (or enable) the power amplifier 316 in an uplink in the signal booster 300. Since the load 350 is connected to the signal booster 300 and radio frequency (RF) signals are not likely to be reflected back on the coaxial cable 355, the power amplifier 316 can be turned on without risk of causing damage to the power amplifier 316. Therefore, after the signal booster 300 is powered on and the load 350 is detected, the power amplifier 316 in the uplink can be turned on.

In one example, the controller 340 can turn on the power amplifier 316 after a defined delay (e.g., 50 milliseconds (ms) to one second) upon detecting that the load 350 is connected to the signal booster 300, which can ensure that the load 350 is in fact connected to the signal booster 300. For example, when a customer is attaching the coaxial cable 355, there can be an intermittent connection for a short period of time. Therefore, adding the defined delay can ensure that the load 350 is in fact connected to the signal booster 300.

In an alternative configuration, on start-up of the signal booster 300, the power amplifiers 316, 326 can be turned off (or disabled) by default. The controller 340 can determine that a load 350 is not connected to the signal booster 300. In this example, the load 350 can be a light emitting diode (LED), but in other examples, the load 350 can be another type of device (e.g., a resistor connected to ground). The controller 340 can determine that a load 350 is not connected to the signal booster 300 based on an absence of current flowing from the controller 340 to a load 350 over a coaxial cable 355. For example, the inside antenna 310 and the load 350 can be included in a cradle that is separate from other components in the signal booster 300. Therefore, when the cradle is unattached from the signal booster 300, the load 350 may not be connected to the first duplexer 312 of the signal booster 300 via the coaxial cable 355. In fact, when the cradle is unattached from the signal booster 300, the coaxial cable 355 can be disconnected from the first duplexer 312, and as a result, current does not flow from the controller 340 to the load 350 via the coaxial cable 355. When the cradle (containing the load 350 and the inside antenna 310) is unattached from the signal booster 300, the controller 340 can know when there is no power being provided from the controller 340 to the load 350 over the coaxial cable 355, and as a result, there is no load 350 connected to the signal booster 300. In another example, the controller 340 can perform current or voltage sensing to determine that there is no load 350 connected to the signal booster 300.

In one example, when there is no load 350 connected to the signal booster 300, the controller 340 can verify that the power amplifier 316 in an uplink in the signal booster 300 is turned off. In other words, turning on the power amplifier 316 when there is no load 350 connected to the signal booster 300 can cause radio frequency (RF) signals to be reflected back on the coaxial cable 350, thereby causing potential damage to the power amplifier 316. Thus, when there is no load 350 connected to the signal booster 300, the controller 340 can turn off the power amplifier 316 or maintain an off-setting for the power amplifier 316.

In one example, at a later time, the controller 340 can determine that a load 350 is connected to the signal booster 300. For example, at the later time, the cradle (containing the load 350 and the inside antenna 310) can become attached to the signal booster 300. As a result, the first duplexer 312 in the signal booster 300 can be communicatively coupled to the inside antenna 310, and the first duplexer 312 can be communicatively coupled to the load 350 via the coaxial cable 355. The controller 340 can determine that the load 350 is connected to the signal booster 300 based on current flowing from the controller 340 to the load 350 over the coaxial cable 355. Since the controller 340 can detect that there is power being provided from the controller 340 to the load 350 over the coaxial cable 355, the controller 340 can determine that the load 350 is connected to the signal booster 300. In another example, the controller 340 can perform current or voltage sensing to determine that the load 350 is connected to the signal booster 300. When the load 350 is connected to the signal booster 300, the controller 340 can turn on (or enable) the power amplifier 316 in the uplink in the signal booster 300. In other words, turning on the power amplifier 316 when the load 350 is connected to the signal booster 300 does not cause RF signals to be reflected back on the coaxial cable 350, and does not cause damage to the power amplifier 316. Thus, when the load 350 is connected to the signal booster 300, the controller 340 can turn on the power amplifier 316. In addition, the controller 340 can turn on the power amplifier 316 after a defined delay upon detecting that the load 350 is connected to the signal booster 300, which can ensure that the load 350 is in fact connected to the signal booster 300.

In one example, the controller 340 can turn on or turn off the power amplifier 316 in the uplink signal path based on a presence or absence of the load 350, respectively. In addition, the controller 340 can turn on or turn off the power amplifier 326 in the downlink signal path based on a presence or absence of the load 350, respectively. Therefore, the controller 340 can protect the power amplifiers 316, 326 in both the uplink signal path and the downlink signal path.

In one configuration, the controller 340 can detect a coaxial cable return loss on the coaxial cable 355 coupled to the signal booster 300. In this example, the coaxial cable 355 can connect the inside antenna 310 and the first duplexer 312. The controller 340 can determine that the coaxial cable return loss is greater than a defined threshold (e.g., 6 dB). For example, the coaxial cable return loss can be greater than the defined threshold when a load 350 (e.g., an LED or a resistor connected to ground) is connected to the signal booster 300. The controller 340 can turn on the power amplifier 316 in the uplink when the coaxial cable return loss exceeds the defined threshold. In other words, since the coaxial cable return loss exceeds the defined threshold, RF signals are not likely to be reflected back on the coaxial cable 355, and the power amplifier 316 can be turned on without risk of causing damage to the power amplifier 316. Therefore, after the signal booster 300 is powered on and the coaxial cable return loss is detected as being greater than the defined threshold, the power amplifier 316 in the uplink can be turned on.

Generally speaking, when there is no electronic component (e.g., LED, resistor) (or load) attached to the signal booster 300, there can be a poor coaxial cable return loss as much of the signal power can be reflected. However, if there is a longer coaxial cable or an antenna or an electronic component attached to the signal booster 300, the coaxial cable return loss can be improved. When the coaxial cable return loss is greater than a defined threshold, an assumption can be made that some electrical component (or load) is attached to the signal booster 300, and therefore, it is safe to turn on an uplink or downlink power amplifier in the signal booster 300.

In an alternative example, the controller 340 can detect a coaxial cable return loss on a coaxial cable that connects the second duplexer 322 and the outside antenna 320. The controller 340 can determine whether the coaxial cable return loss exceeds a defined threshold, and if so, the controller 340 can turn on the power amplifier 316 in the uplink.

In an alternative configuration, the controller 340 can detect a coaxial cable return loss on the coaxial cable 355 that connects the inside antenna 310 and the first duplexer 312. The controller 340 can determine that the coaxial cable return loss is less than a defined threshold. For example, the coaxial cable return loss can be less than the defined threshold when there is no load 350 (e.g., an LED or a resistor connected to ground) connected to the signal booster 300. In this case, the controller 340 can verify that the power amplifier 316 in the uplink is turned off. In other words, turning on the power amplifier 316 when there is no load 350 connected to the signal booster 300 can cause RF signals to be reflected back on the coaxial cable 350, thereby causing potential damage to the power amplifier 316. Thus, when there is no load 350 connected to the signal booster 300, the controller 340 can turn off the power amplifier 316 or maintain an off-setting for the power amplifier 316. At a later time, the controller 340 can determine that the coaxial cable return loss exceeds the defined threshold. The coaxial cable return loss can exceed the defined threshold when the load 350 (e.g., an LED or a resistor connected to ground) is connected to the signal booster 300. The controller 340 can turn on the power amplifier 316 in the uplink when the coaxial cable return loss exceeds the defined threshold.

In one example, the controller 340 can turn on or turn off the power amplifier 316 in the uplink signal path depending on the coaxial cable return loss exceeding or not exceeding the defined threshold, respectively. In addition, the controller 340 can turn on or off the power amplifier 326 in the downlink signal path depending on the coaxial cable return loss exceeding or not exceeding the defined threshold, respectively. Therefore, the controller 340 can protect the power amplifiers 316, 326 in both the uplink signal path and the downlink signal path.

In one configuration, the signal booster 300 can: determine whether a load 350 (e.g., an LED or a resistor connected to ground) is connected to the signal booster 300, protect a power amplifier in the signal booster 300 (e.g., the uplink power amplifier 316 or the downlink power amplifier 326) when the load 350 is not connected to the signal booster 300, and unprotect the power amplifier when the load 350 is connected to the signal booster 300. For example, the signal booster 300 can protect the power amplifier by disabling (or turning off) the power amplifier when the load 350 is not connected to the signal booster 300. As another example, the signal booster 300 can unprotect the power amplifier by enabling (or turning on) the power amplifier when the load 350 is connected to the signal booster 300. As yet another example, the signal booster 300 can protect the power amplifier by switching in a load 350 between the power amplifier and an antenna of the signal booster 300 to present an increased coaxial cable return loss to the power amplifier, wherein the increased coaxial cable return loss is on a coaxial cable 355 coupled to the power amplifier. In an alternative example, a pi-pad or t-pad matched resistive load can be switched in, a power to ground can be shunted through a resistive load.

In one example, the signal booster 300 can determine that the load 350 is not connected to the signal booster 300 based on an absence of a current flow from the controller 340 to the load 350 over a coaxial cable 355, or the signal booster 300 can determine that the load 350 is connected to the signal booster 300 based on a current flow from the controller 340 to the load 350 over the coaxial cable 355. In another example, the signal booster 300 can protect the power amplifier by disabling the power amplifier when a coaxial cable return loss on a coaxial cable 355 coupled to the power amplifier is less than a defined threshold, wherein the coaxial cable return loss is less than the defined threshold when the load 350 is not connected to the signal booster 300. In yet another example, the signal booster 300 can unprotect the power amplifier by enabling the power amplifier when a coaxial cable return loss on a coaxial cable 355 coupled to the power amplifier exceeds a defined threshold, wherein the coaxial cable return loss exceeds the defined threshold when the load 350 is connected to the signal booster 300.

In one example, the signal booster 300 can protect the power amplifier by disabling the power amplifier as a default setting. In another example, the signal booster 300 can unprotect the power amplifier by enabling the power amplifier after a defined delay when the load 350 is connected to the signal booster 300. In yet another example, the signal booster 300 can include an outside antenna 320 and an inside antenna 310, and the load 350 can be communicatively coupled to an inside antenna port of the inside antenna 310 or an outside antenna port of the outside antenna 320. In a further example, the load 350 can be included in a cradle that is attached to the signal booster 300.

Figure 4:
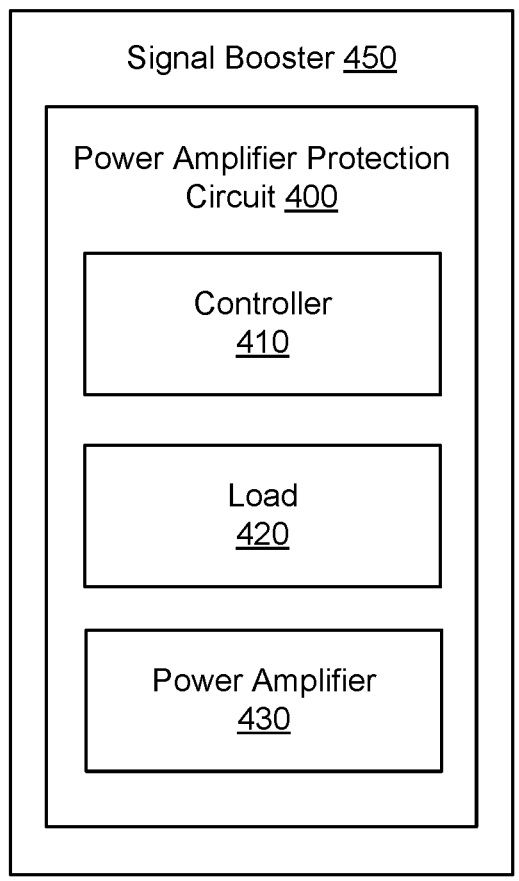
FIG. 4 illustrates a power amplifier protection circuit in accordance with an example.

FIG. 4 illustrates a power amplifier protection circuit 400. The power amplification protection circuit 400 can, via a controller 410, determine whether a load 420 (e.g., an LED or a resistor connected to ground) is connected to the power amplifier protection circuit 400. The power amplification protection circuit 400 can, via the controller 410, protect a power amplifier 430 when the load 420 is not connected to the power amplifier protection circuit 400. The power amplification protection circuit 400 can, via the controller 410, unprotect the power amplifier 430 when the load 420 is connected to the power amplifier protection circuit 400. The power amplifier protection circuit 400 can be included in a signal booster 450 (or a repeater).

In one example, the power amplifier protection circuit 400 can protect the power amplifier 430 by disabling the power amplifier 430 when the load 420 is not connected to the power amplifier protection circuit 400. In another example, the power amplifier protection circuit 400 can unprotect the power amplifier 430 by enabling the power amplifier 430 when the load 420 is connected to the power amplifier protection circuit 400. In yet another example, the power amplifier protection circuit 400 can protect the power amplifier 430 by switching in a load 420 between the power amplifier 430 and an antenna to present an increased return loss to the power amplifier 430, wherein the increased coaxial cable return loss is on a coaxial cable coupled to the power amplifier 430.

In one example, the power amplifier protection circuit 400 can determine that the load 420 is not connected to the power amplifier protection circuit 400 based on an absence of a current flow from the controller 410 to the load 420 over a coaxial cable, or the power amplifier protection circuit 400 can determine that the load 420 is connected to the power amplifier protection circuit 400 based on a current flow from the controller 410 to the load 420 over the coaxial cable. In yet another example, the power amplifier protection circuit 400 can protect the power amplifier 430 by disabling the power amplifier 430 when a coaxial cable return loss on a coaxial cable coupled to the controller 410 is less than a defined threshold, wherein the coaxial cable return loss is less than the defined threshold when the load 420 is not connected to the power amplifier protection circuit 400. In yet another example, the power amplifier protection circuit 400 can unprotect the power amplifier 430 by enabling the power amplifier 430 when a coaxial cable return loss on a coaxial cable coupled to the controller 410 exceeds a defined threshold, wherein the coaxial cable return loss exceeds the defined threshold when the load 420 is connected to the power amplifier protection circuit 400.

Figure 5:
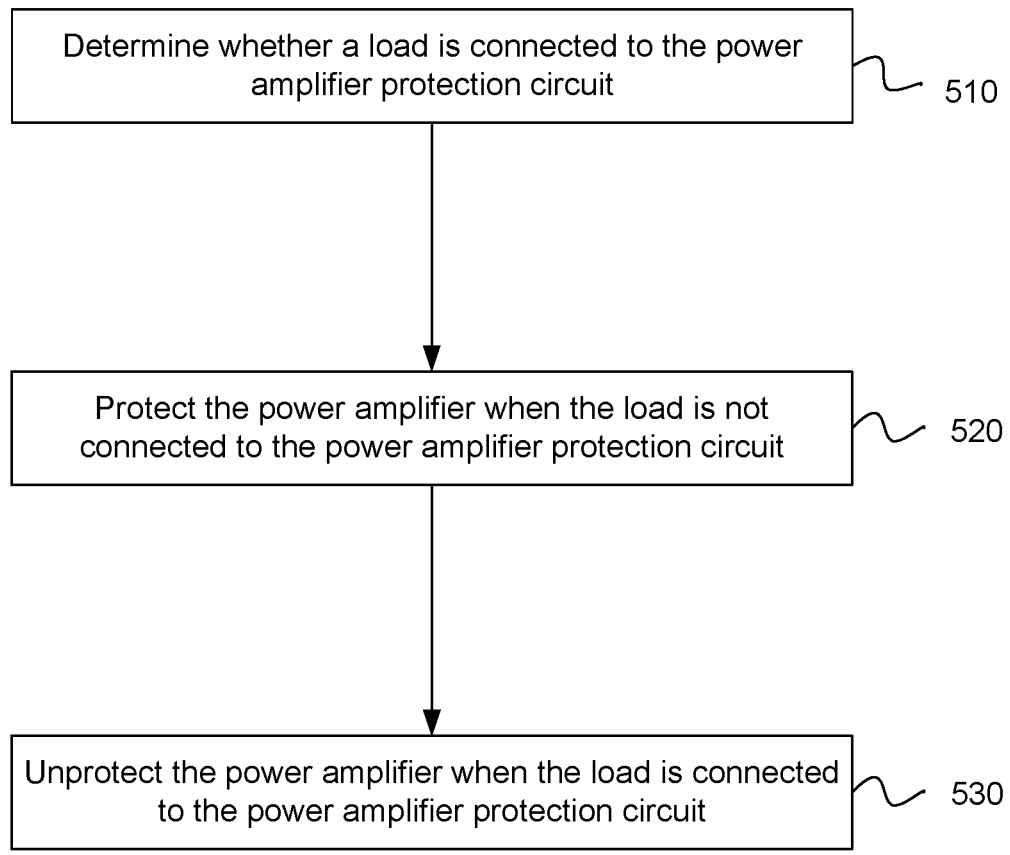
FIG. 5 depicts functionality of a power amplifier protection circuit in accordance with an example.

FIG. 5 depicts functionality of a power amplifier protection circuit. The power amplifier protection circuit can include a power amplifier and a controller. The controller can be configured to determine whether a load is connected to the power amplifier protection circuit, as in block 510. The controller can be configured to protect the power amplifier when the load is not connected to the power amplifier protection circuit, as in block 520. The controller can be configured to unprotect the power amplifier when the load is connected to the power amplifier protection circuit, as in block 530.

Figure 6:
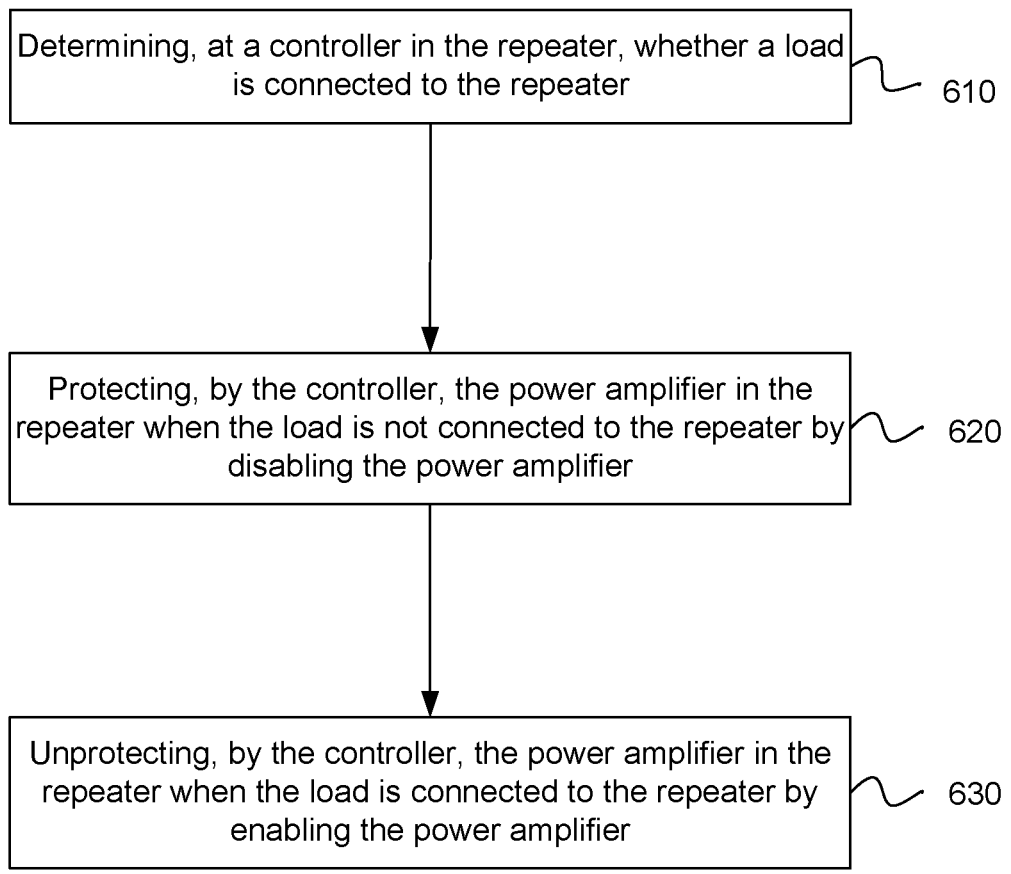
FIG. 6 is a flowchart illustrating a method for protecting a power amplifier in a repeater in accordance with an example.

FIG. 6 is a flowchart illustrating a method for protecting a power amplifier in a repeater. The method may be executed as instructions on a machine, where the instructions are included on at least one computer readable medium or one non-transitory machine readable storage medium. The method includes the operation of determining, at a controller in the repeater, whether a load is connected to the repeater, as in block 610. The method includes the operation of protecting, by the controller, the power amplifier in the repeater when the load is not connected to the repeater by disabling the power amplifier, as in block 620. The method includes the operation of unprotecting, by the controller, the power amplifier in the repeater when the load is connected to the repeater by enabling the power amplifier, as in block 630.

Figure 7:
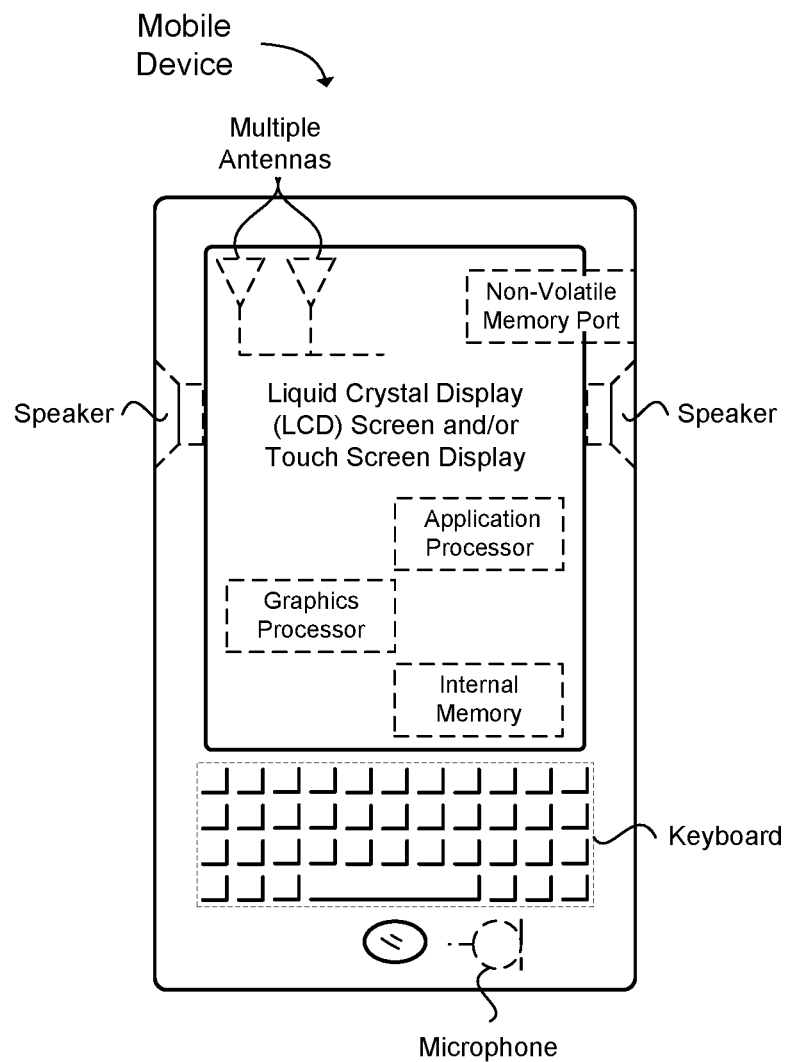
FIG. 7 illustrates a wireless device in accordance with an example.

FIG. 7 provides an example illustration of the wireless device, such as a user equipment (UE), a mobile station (MS), a mobile communication device, a tablet, a handset, a wireless transceiver coupled to a processor, or other type of wireless device. The wireless device can include one or more antennas configured to communicate with a node or transmission station, such as an access point (AP), a base station (BS), an evolved Node B (eNB), a baseband unit (BBU), a remote radio head (RRH), a remote radio equipment (RRE), a relay station (RS), a radio equipment (RE), a remote radio unit (RRU), a central processing module (CPM), or other type of wireless wide area network (WWAN) access point. The wireless device can communicate using separate antennas for each wireless communication standard or shared antennas for multiple wireless communication standards. The wireless device can communicate in a wireless local area network (WLAN), a wireless personal area network (WPAN), and/or a WWAN.

FIG. 6 also provides an illustration of a microphone and one or more speakers that can be used for audio input and output from the wireless device. The display screen can be a liquid crystal display (LCD) screen, or other type of display screen such as an organic light emitting diode (OLED) display. The display screen can be configured as a touch screen. The touch screen can use capacitive, resistive, or another type of touch screen technology. An application processor and a graphics processor can be coupled to internal memory to provide processing and display capabilities. A non-volatile memory port can also be used to provide data input/output options to a user. The non-volatile memory port can also be used to expand the memory capabilities of the wireless device. A keyboard can be with the wireless device or wirelessly connected to the wireless device to provide additional user input. A virtual keyboard can also be provided using the touch screen.

EXAMPLES

The following examples pertain to specific technology embodiments and point out specific features, elements, or actions that can be used or otherwise combined in achieving such embodiments.

Example 1 includes at least one machine readable storage medium having instructions embodied thereon for protecting a power amplifier in a repeater, the instructions when executed by a controller in the repeater perform the following: determining, at the controller in the repeater, whether a load is connected to the repeater; protecting, by the controller, the power amplifier in the repeater when the load is not connected to the repeater by disabling the power amplifier; and unprotecting, by the controller, the power amplifier in the repeater when the load is connected to the repeater by enabling the power amplifier.

Example 2 includes the at least one machine readable storage medium of Example 1, wherein protecting the power amplifier further comprises switching in a load between the power amplifier and an antenna to present an increased return loss to the power amplifier.

Example 3 includes the at least one machine readable storage medium of any of Examples 1 to 2, further comprising instructions when executed perform the following: determining that the load is not connected to the repeater based on an absence of a current flow from the controller to the load; or determining that the load is connected to the repeater based on a current flow from the controller to the load.

Example 4 includes the at least one machine readable storage medium of any of Examples 1 to 3, wherein the load is a light emitting diode (LED) or a resistor connected to ground.

Example 5 includes the at least one machine readable storage medium of any of Examples 1 to 4, wherein protecting the power amplifier comprises disabling the power amplifier when a return loss on a repeater port coupled to the controller is less than a defined threshold, wherein the return loss is less than the defined threshold when the load is not connected to the repeater.

Example 6 includes the at least one machine readable storage medium of any of Examples 1 to 5, wherein unprotecting the power amplifier comprises enabling the power amplifier when a return loss on a repeater port coupled to the controller exceeds a defined threshold, wherein the return loss exceeds the defined threshold when the load is connected to the repeater.

Example 7 includes a repeater, comprising: a power amplifier; and a controller configured to: determine whether a load is connected to the repeater; protect the power amplifier when the load is not connected to the repeater by disabling the power amplifier; and unprotect the power amplifier when the load is connected to the repeater by enabling the power amplifier.

Example 8 includes the repeater of Example 7, wherein the controller that is configured to protect the power amplifier is further configured to switch in a load between the power amplifier and an antenna of the repeater to present an increased return loss to the power amplifier.

Example 9 includes the repeater of any of Examples 7 to 8, wherein the controller is further configured to: determine that the load is not connected to the repeater based on an absence of a current flow from the controller to the load; or determine that the load is connected to the repeater based on a current flow from the controller to the load.

Example 10 includes the repeater of any of Examples 7 to 9, wherein the load is a light emitting diode (LED).

Example 11 includes the repeater of any of Examples 7 to 10, wherein the load is a resistor connected to ground.

Example 12 includes the repeater of any of Examples 7 to 11, wherein the controller that is configured to protect the power amplifier is configured to disable the power amplifier when return loss on a repeater port coupled to the power amplifier is less than a defined threshold, wherein the return loss is less than the defined threshold when the load is not connected to the repeater.

Example 13 includes the repeater of any of Examples 7 to 12, wherein the controller that is configured to unprotect the power amplifier is configured to enable the power amplifier when a return loss on a repeater port coupled to the power amplifier exceeds a defined threshold, wherein the return loss exceeds the defined threshold when the load is connected to the repeater.

Example 14 includes the repeater of any of Examples 7 to 13, wherein the power amplifier is included in an uplink signal path or a downlink signal path.

Example 15 includes the repeater of any of Examples 7 to 14, further comprising one or more amplifiers and one or more filters to amplify and filter signals.

Example 16 includes the repeater of any of Examples 7 to 15, wherein the controller that is configured to protect the power amplifier is configured to disable the power amplifier as a default setting.

Example 17 includes the repeater of any of Examples 7 to 16, wherein the controller that is configured to unprotect the power amplifier is configured to enable the power amplifier after a defined delay when the load is connected to the repeater.

Example 18 includes the repeater of any of Examples 7 to 17, further comprising: an outside antenna; and an inside antenna, wherein the load is communicatively coupled to an inside antenna port of the inside antenna or an outside antenna port of the outside antenna.

Example 19 includes the repeater of any of Examples 7 to 18, wherein the load is included in a cradle that is attached to the repeater.

Example 20 includes a power amplifier protection circuit, comprising: a power amplifier; and a controller configured to: determine whether a load is connected to the power amplifier protection circuit; protect the power amplifier when the load is not connected to the power amplifier protection circuit; and unprotect the power amplifier when the load is connected to the power amplifier protection circuit.

Example 21 includes the power amplifier protection circuit of Example 20, wherein the controller that is configured to protect the power amplifier is configured to disable the power amplifier when the load is not connected to the power amplifier protection circuit.

Example 22 includes the power amplifier protection circuit of any of Examples 20 to 21, wherein the controller that is configured to unprotect the power amplifier is configured to enable the power amplifier when the load is connected to the power amplifier protection circuit.

Example 23 includes the power amplifier protection circuit of any of Examples 20 to 22, wherein the controller that is configured to protect the power amplifier is configured to switch in a load between the power amplifier and an antenna to present an increased return loss to the power amplifier.

Example 24 includes the power amplifier protection circuit of any of Examples 20 to 23, wherein the controller is further configured to: determine that the load is not connected to the power amplifier protection circuit based on an absence of a current flow from the controller to the load; or determine that the load is connected to the power amplifier protection circuit based on a current flow from the controller to the load.

Example 25 includes the power amplifier protection circuit of any of Examples 20 to 24, wherein the load is a light emitting diode (LED).

Example 26 includes the power amplifier protection circuit of any of Examples 20 to 25, wherein the load is a resistor connected to ground.

Example 27 includes the power amplifier protection circuit of any of Examples 20 to 26, wherein the controller that is configured to protect the power amplifier is configured to disable the power amplifier when a return loss on a port coupled to the controller is less than a defined threshold, wherein the return loss is less than the defined threshold when the load is not connected to the power amplifier protection circuit.

Example 28 includes the power amplifier protection circuit of any of Examples 20 to 27, wherein the controller that is configured to unprotect the power amplifier is configured to enable the power amplifier when a return loss on a port coupled to the controller exceeds a defined threshold, wherein the return loss exceeds the defined threshold when the load is connected to the power amplifier protection circuit.

Example 29 includes the power amplifier protection circuit of any of Examples 20 to 28, wherein the power amplifier protection circuit is included in a repeater or a signal booster.

Example 30 includes a repeater operable to protect a power amplifier in the repeater, the repeater comprising: means for determining whether a load is connected to the repeater; means for protecting the power amplifier in the repeater when the load is not connected to the repeater by disabling the power amplifier; and means for unprotecting the power amplifier in the repeater when the load is connected to the repeater by enabling the power amplifier.

Example 31 includes the repeater of Example 30, wherein protecting the power amplifier further comprises switching in a load between the power amplifier and an antenna to present an increased return loss to the power amplifier.

Example 32 includes the repeater of any of Examples 30 to 31, further comprising: means for determining that the load is not connected to the repeater based on an absence of a current flow from the controller to the load; or means for determining that the load is connected to the repeater based on a current flow from the controller to the load.

Example 33 includes the repeater of any of Examples 30 to 32, wherein the load is a light emitting diode (LED) or a resistor connected to ground.

Example 34 includes the repeater of any of Examples 30 to 33, wherein protecting the power amplifier comprises disabling the power amplifier when a return loss on a repeater port coupled to the controller is less than a defined threshold, wherein the return loss is less than the defined threshold when the load is not connected to the repeater.

Example 35 includes the repeater of any of Examples 30 to 34, wherein unprotecting the power amplifier comprises enabling the power amplifier when a return loss on a repeater port coupled to the controller exceeds a defined threshold, wherein the return loss exceeds the defined threshold when the load is connected to the repeater.

Various techniques, or certain aspects or portions thereof, can take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

It should be understood that many of the functional units described in this specification have been labeled as modules, in order to more particularly emphasize their implementation independence. For example, a module can be implemented as a hardware circuit comprising custom very-large-scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices or the like.

In one example, multiple hardware circuits or multiple processors can be used to implement the functional units described in this specification. For example, a first hardware circuit or a first processor can be used to perform processing operations and a second hardware circuit or a second processor (e.g., a transceiver or a baseband processor) can be used to communicate with other entities. The first hardware circuit and the second hardware circuit can be incorporated into a single hardware circuit, or alternatively, the first hardware circuit and the second hardware circuit can be separate hardware circuits.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together, but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network. The modules can be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics can be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. At least one machine readable storage medium having instructions embodied thereon for protecting a power amplifier in a repeater, the instructions when executed by a controller in the repeater perform the following:
determining, at the controller in the repeater, whether a load is connected to the repeater;
protecting, by the controller, the power amplifier in the repeater when the load is not connected to the repeater by disabling the power amplifier when a return loss on a repeater port coupled to the controller is less than a defined threshold; and
unprotecting, by the controller, the power amplifier in the repeater when the load is connected to the repeater by enabling the power amplifier.

2. The at least one machine readable storage medium of claim 1, wherein protecting the power amplifier further comprises switching in a load between the power amplifier and an antenna to present an increased return loss to the power amplifier.

3. The at least one machine readable storage medium of claim 1, further comprising instructions when executed perform the following:
determining that the load is not connected to the repeater based on an absence of a current flow from the controller to the load; or
determining that the load is connected to the repeater based on a current flow from the controller to the load.

4. The at least one machine readable storage medium of claim 1, wherein the load is a light emitting diode (LED) or a resistor connected to ground.

5. The at least one machine readable storage medium of claim 1, wherein the return loss is less than the defined threshold when the load is not connected to the repeater.

6. The at least one machine readable storage medium of claim 1, wherein unprotecting the power amplifier comprises enabling the power amplifier when a return loss on a repeater port coupled to the controller exceeds a defined threshold, wherein the return loss exceeds the defined threshold when the load is connected to the repeater.

7. A repeater, comprising:
a power amplifier; and
a controller configured to:
determine whether a load is connected to the repeater;
protect the power amplifier when the load is not connected to the repeater by disabling the power amplifier when a return loss on a repeater port coupled to the power amplifier is less than a defined threshold; and
unprotect the power amplifier when the load is connected to the repeater by enabling the power amplifier.

8. The repeater of claim 7, wherein the controller that is configured to protect the power amplifier is further configured to switch in a load between the power amplifier and an antenna of the repeater to present an increased return loss to the power amplifier.

9. The repeater of claim 7, wherein the controller is further configured to:
determine that the load is not connected to the repeater based on an absence of a current flow from the controller to the load; or
determine that the load is connected to the repeater based on a current flow from the controller to the load.

10. The repeater of claim 7, wherein the load is a light emitting diode (LED).

11. The repeater of claim 7, wherein the load is a resistor connected to ground.

12. The repeater of claim 7, wherein the return loss is less than the defined threshold when the load is not connected to the repeater.

13. The repeater of claim 7, wherein the controller that is configured to unprotect the power amplifier is configured to enable the power amplifier when a return loss on a repeater port coupled to the power amplifier exceeds a defined threshold, wherein the return loss exceeds the defined threshold when the load is connected to the repeater.

14. The repeater of claim 7, wherein the power amplifier is included in an uplink signal path or a downlink signal path.

15. The repeater of claim 7, further comprising one or more amplifiers and one or more filters to amplify and filter signals.

16. The repeater of claim 7, wherein the controller that is configured to protect the power amplifier is configured to disable the power amplifier as a default setting.

17. The repeater of claim 7, wherein the controller that is configured to unprotect the power amplifier is configured to enable the power amplifier after a defined delay when the load is connected to the repeater.

18. The repeater of claim 7, further comprising:
an outside antenna; and
an inside antenna,
wherein the load is communicatively coupled to an inside antenna port of the inside antenna or an outside antenna port of the outside antenna.

19. The repeater of claim 7, wherein the load is included in a cradle that is attached to the repeater.

20. A power amplifier protection circuit, comprising:
a power amplifier; and
a controller configured to:
determine whether a load is connected to the power amplifier protection circuit;
protect the power amplifier when the load is not connected to the power amplifier protection circuit by disabling the power amplifier when a return loss on a port coupled to the controller is less than a defined threshold; and
unprotect the power amplifier when the load is connected to the power amplifier protection circuit.

21. The power amplifier protection circuit of claim 20, wherein the controller that is configured to protect the power amplifier is configured to disable the power amplifier when the load is not connected to the power amplifier protection circuit.

22. The power amplifier protection circuit of claim 20, wherein the controller that is configured to unprotect the power amplifier is configured to enable the power amplifier when the load is connected to the power amplifier protection circuit.

23. The power amplifier protection circuit of claim 20, wherein the controller that is configured to protect the power amplifier is configured to switch in a load between the power amplifier and an antenna to present an increased return loss to the power amplifier.

24. The power amplifier protection circuit of claim 20, wherein the controller is further configured to:
determine that the load is not connected to the power amplifier protection circuit based on an absence of a current flow from the controller to the load; or
determine that the load is connected to the power amplifier protection circuit based on a current flow from the controller to the load.

25. The power amplifier protection circuit of claim 20, wherein the load is a light emitting diode (LED).

26. The power amplifier protection circuit of claim 20, wherein the load is a resistor connected to ground.

27. The power amplifier protection circuit of claim 20, wherein the return loss is less than the defined threshold when the load is not connected to the power amplifier protection circuit.

28. The power amplifier protection circuit of claim 20, wherein the controller that is configured to unprotect the power amplifier is configured to enable the power amplifier when a return loss on a port coupled to the controller exceeds a defined threshold, wherein the return loss exceeds the defined threshold when the load is connected to the power amplifier protection circuit.

29. The power amplifier protection circuit of claim 20, wherein the power amplifier protection circuit is included in a repeater or a signal booster.

* * * * *